(12) United States Patent
Ahammed et al.

(10) Patent No.: US 12,451,686 B2
(45) Date of Patent: Oct. 21, 2025

(54) ELECTROSTATIC DISCHARGE ROBUSTNESS FOR A SINGLE RAIL TRANSMITTING DRIVER

(71) Applicant: QUALCOMM Incorporated, San Diego, CA (US)

(72) Inventors: Jaseem Ahammed, San Diego, CA (US); Ashwin Sethuram, San Clemente, CA (US); Gurmukh Singh, San Marcos, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 413 days.

(21) Appl. No.: 18/157,211

(22) Filed: Jan. 20, 2023

(65) Prior Publication Data

US 2024/0250526 A1    Jul. 25, 2024

(51) Int. Cl.
  *H02H 9/04*     (2006.01)
(52) U.S. Cl.
  CPC .................. *H02H 9/046* (2013.01)
(58) Field of Classification Search
  CPC ........ H02H 9/02; H02H 9/046; H10D 89/611; H10D 89/921; H10D 89/811; H03K 19/00315
  See application file for complete search history.

(56) References Cited

U.S. PATENT DOCUMENTS

| | | | |
|---|---|---|---|
| 9,368,485 B1* | 6/2016 | Chu | H10D 89/921 |
| 2004/0085093 A1* | 5/2004 | Marr | H03K 5/08 |
| | | | 326/82 |
| 2021/0050341 A1* | 2/2021 | Wang | H10D 89/611 |
| 2022/0209527 A1* | 6/2022 | de Raad | H02H 9/04 |
| 2023/0148160 A1* | 5/2023 | Sivakumar | H02H 9/046 |
| | | | 361/56 |

FOREIGN PATENT DOCUMENTS

KR    101145791 B1 *    5/2012

* cited by examiner

*Primary Examiner* — Danny Nguyen
*Assistant Examiner* — Nicolas Bellido
(74) *Attorney, Agent, or Firm* — Loza & Loza, LLP

(57) ABSTRACT

An ESD protection circuit in an interface circuit has a first diode coupled between a power source of an integrated circuit device and an input/output pad of the integrated circuit device, a second diode coupled between a first terminal of a first resistive element and the input/output pad, with a second terminal of the first resistive element being coupled to the power source, a second resistive element that couples the second diode to the first diode and to the input/output pad; a first clamping circuit coupled between the power source and a ground reference of the integrated circuit device, and a second clamping circuit coupled between the first terminal of the first resistive element and the ground reference. The power source supplies a driver circuit coupled to the input/output pad.

25 Claims, 6 Drawing Sheets

ELECTROSTATIC DISCHARGE ROBUSTNESS FOR A SINGLE RAIL TRANSMITTING DRIVER

TECHNICAL FIELD

The present disclosure generally relates to interface circuits for integrated circuits and, more particularly, to circuits that can enhance electrostatic discharge protection in multi-voltage rails in interface circuits.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Continuous service enhancements require the advancement of process technologies that can provide integrated circuit (IC) devices with ever increasing performance and transistor densities.

Advancements in process technologies tend to reduce transistor gate length and other feature sizes with IC devices. Reductions in gate length and feature sizes can increase the susceptibility of IC devices to electrostatic discharge (ESD) events. IC devices often include ESD protection circuits that can protect interface circuits during different types of ESD events. IC devices may be tested to ensure that they meet minimum industry standards regarding ESD protection. IC device qualification processes may include testing the susceptibility of the IC device to ESD events based on a human-body model (HBM) or based on a charged-device model (CDM) characterization of ESD events. Some ESD protection circuits are based on or evaluated using an HBM or a CDM. The HBM is intended to characterize the susceptibility of devices to damage from ESD events of ±1 kVolt resulting from human touching of an electronic device. The CDM is intended to characterize the susceptibility of devices to damage from ESD events of ±250 Volts that relate to sudden discharges of energy accumulated in an IC chip or package through direct contact charging or field-induced charging.

Changes in certain aspects of large scale IC designs and semiconductor manufacturing processes, including reductions in process minimum feature size can create new or different susceptibilities of IC devices to ESD events. Accordingly, there is an ongoing need for improvements in ESD protection for IC interface circuits.

SUMMARY

Certain aspects of the disclosure relate to systems, apparatus, methods and techniques that can provide enhanced ESD protection circuits in certain IC devices, including IC devices that employ multiple voltage domains. Some examples disclosed herein are applicable to interface circuits in an IC, including in high-speed, low-power synchronous dynamic random access memory. Some examples disclosed herein are applicable to the protection of circuits at the boundary between a low-voltage domain that is used to implement certain core features of the IC device and a higher-voltage domain that is used for device input and output (input/output or I/O).

In one aspect of the disclosure, an ESD protection circuit in an interface circuit has a first diode coupled between a power source of an integrated circuit device and an input/output pad of the integrated circuit device. The power source supplies a driver circuit coupled to the input/output pad. A second diode is coupled between a first terminal of a first resistive element and the input/output pad. A second terminal of the first resistive element is coupled to the power source. A second resistive element couples the second diode to the first diode and to the input/output pad. A first clamping circuit is coupled between the power source and a ground reference of the integrated circuit device. A second clamping circuit is coupled between the first terminal of the first resistive element and the ground reference.

In one aspect of the disclosure, an apparatus has means for driving an input/output pad of an integrated circuit device, means for diverting a first portion of an electrostatic discharge current that is conducted through the input/output pad, including a first diode that is coupled between a power source of the integrated circuit device and the input/output pad. The power source supplies the means for driving the input/output pad. The apparatus also has means for diverting a second portion of the electrostatic discharge current, including a second diode that is coupled between a first terminal of a first resistive element and the input/output pad. A second terminal of the first resistive element is coupled to the power source. A terminal of the second diode is coupled to the input/output pad through a resistive element coupled to a corresponding terminal of the first diode. The apparatus also has means for clamping voltages, including a first clamping circuit coupled between the power source and a ground reference of the integrated circuit device and a second clamping circuit coupled between the first terminal of the first resistive element and the ground reference.

In one aspect of the disclosure, a method for providing ESD protection includes coupling a first diode between a power source of an integrated circuit device and an input/output pad of the integrated circuit device, coupling a second diode between a first terminal of a first resistive element and the input/output pad, coupling the second diode to the first diode and to the input/output pad through a second resistive element, coupling a first clamping circuit between the power source and a ground reference of the integrated circuit device, and coupling a second clamping circuit between the first terminal of the first resistive element and the ground reference. The power source may supply a driver circuit coupled to the input/output pad. A second terminal of the first resistive element may be coupled to the power source.

In certain examples, the first resistive element has a resistance configured to restrict current flow between the power source and the second clamping circuit during an electrostatic discharge event. The resistance of the first resistive element may exceed 5 kiloohms. In one example, the first resistive element has a resistance of 20 kiloohms.

In certain examples, the second clamping circuit is activated during an electrostatic discharge event by a trigger signal provided by the first clamping circuit. The first clamping circuit and the second clamping circuit may be configured to divert at least a portion of an electrostatic discharge current from the driver circuit. The electrostatic discharge current may enter the integrated circuit device through the input/output pad during an electrostatic discharge event.

In certain examples, the second resistive element includes an interconnect that couples a terminal of the second diode to a corresponding terminal of the first diode and that has a resistance that produces a voltage differential between the terminal of the second diode and the corresponding terminal of the first diode during an electrostatic discharge event. The second resistive element may include a parasitic resistance.

In certain examples, a third diode has a first terminal coupled to the ground reference and a second terminal coupled to the input/output pad, and a fourth diode has a first terminal coupled to the ground reference and a second terminal coupled to the input/output pad. The first diode, the second diode, the third diode and the fourth diode may be reverse biased before the electrostatic discharge current enters the integrated circuit device.

DETAILED DESCRIPTION

Figure 1:
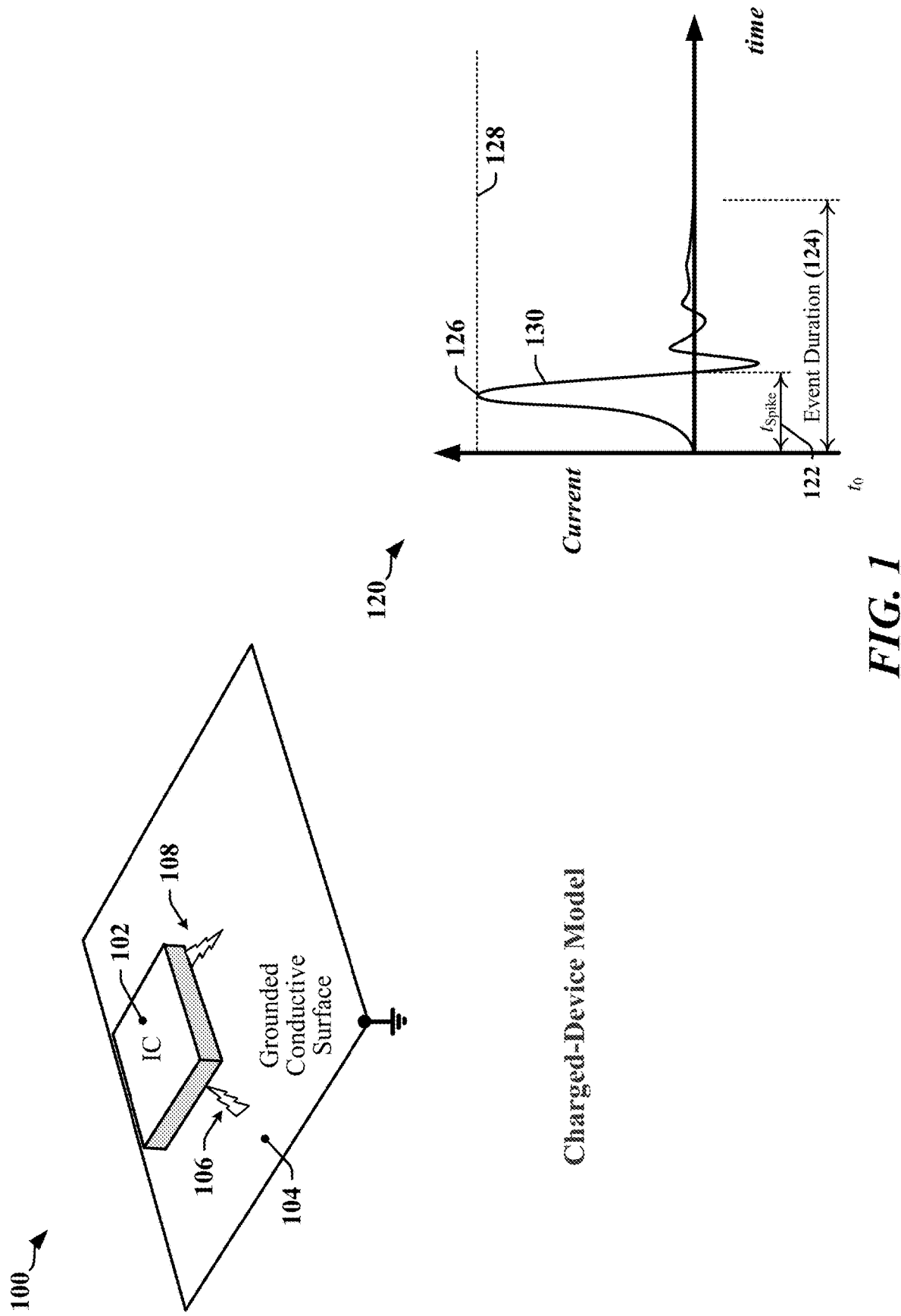
FIG. 1 illustrates an example of ESD event.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and operating frequencies. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

In many implementations, an IC device may include and/or distinguish between internal core circuits and peripheral or I/O circuits. The internal core circuits may be included in a section of the IC that may be referred to simply as a "core" that performs certain functions including storing data (memory), managing stored data, performing certain logic functions, processing-specific functions, cryptography, image processing and so on. More than one section of an IC may be defined as a core. In many examples, the devices and/or circuits in a core may be configurable to operate at the highest possible operating frequency enabled by the process technology. In many examples, the operating frequency of circuits in a core may be constrained by a power budget and the operating frequency of some core circuits may be configured to obtain fastest operation within the power budget. Lower power consumption in high speed circuits can be achieved by reducing the operating voltage of the core, and process technologies have been evolving to support ever-lower core operating voltages.

The functions of the peripheral or I/O circuits in an IC include the control and driving of data communication and general purpose I/O (GPIO) signals at higher voltage levels than the voltage level used to operate core devices and circuits. Peripheral and/or I/O circuits may be required to support higher amperage current flows into and out of the IC device. In some examples, operating voltages, currents and operating frequencies are mandated for the peripheral or I/O circuits by industry or proprietary standards. The differences between operating characteristics of the core and the peripheral or I/O circuits may increase with every generation of process technology.

An IC device typically receives power from an external power supply. Examples of external power supplies include batteries, solar cells or solar panels, switching power supplies and other types of power converters. The external power supply may provide power at different voltage levels, where the voltage levels are measured with respect to a ground reference. In one example, the ground reference may be designated to be a zero-volt level. Multiple rails may be provided to carry current to or from the power supply. Each rail provides a low resistance path for current flows and each rail may be implemented using one or more wires, connectors, interconnects, traces on a circuit board or the like. The IC device may be coupled to two or more of the rails and may extend these coupled rails internally using low-impedance interconnects or conductive planes with the IC structure. The internal rails conduct current to the various sections of the IC device at a defined voltage level.

In some examples, the internal rails may be referred to as internal power sources or power sources, although the rails may serve as conduits for external power sources. In some examples, internal power sources may include internal rails that are driven by power conditioning circuits, power conversion circuits or circuits that step or step down voltage levels for use within the IC device.

In some examples, the internal rails may be labeled according to usage. In some examples, the ground reference of an IC device or of a section of an IC device may be labeled Voltage-Source-Source ($V_{ss}$), and non-zero voltage rails may be labeled Voltage-Drain-Drain ($V_{dd}$). In many examples, the IC may provide multiple $V_{dd}$ rails, labeled $V_{dd}1, V_{dd}2, V_{dd}3, \ldots V_{dd}X$, etc. The ground reference may provide a return path for currents flowing through the IC device.

In some instances, different voltage domains may be identified in an IC device. Each voltage domain may include multiple devices or circuits that receive power at a common voltage level. In one example, a first voltage domain may include devices that are coupled between $V_{ss}$ and $V_{dd}1$, a second voltage domain may include devices that are coupled between $V_{ss}$ and $V_{dd}2$, a third voltage domain may include devices that are coupled between $V_{ss}$ and $V_{dd}3$, and so on. A voltage domain may also be referred to as a power domain. The evolution of process technology and the corresponding evolution of transistor technology has led to decreased gate oxide thickness and lower operating voltages in some types of circuits.

Certain aspects of this disclosure relate to I/O circuits in IC devices, including I/O circuits included or controlled by circuits that provide an interface between core circuits and peripherals. Peripherals and core circuits may be implemented using the same or different process technologies and may operate at the same or different voltages. In some examples, an interface may support low-speed, higher-voltage peripherals. In some examples, an interface may support high-speed, lower-voltage peripherals. In some examples, an interface may connect to a communication bus that operates at frequencies and voltages defined by industry standards and that imposes current and power requirements on I/O circuits.

In one example, certain aspects of the disclosure are applicable to I/O circuits that provide an interface between core circuits and memory devices. Many mobile devices employ Synchronous Dynamic Random Access Memory (SDRAM), including Low-Power Double Data Rate SDRAM, which may be referred to as low-power DDR SDRAM, LPDDR SDRAM or, in some instances, LPDDRx where x describes the technology generation of the LPDDR SDRAM. Later generations of LPDDR SDRAM designed to operate at higher operating frequencies may employ lower voltage levels in the core of an SoC or memory device to mitigate for increased power associated with the higher operating frequencies. Voltage levels for I/O signals may be higher than core or memory voltage levels and stacked transistors may be employed in I/O interface circuits to provide output drivers that can span the difference between core or memory voltage levels and voltage levels of I/O pads.

In some mobile, battery-powered applications, multiple voltage rails may be used to conserve power and reduce heat generation. In one example, an SoC output driver may include a voltage rail shared between the output driver and one or more peripheral devices or circuits, and may include voltage rails used exclusively by core circuits or by peripheral devices or circuits.

Certain design enhancements implemented to support higher operating frequencies while minimizing power consumption and dissipation may increase susceptibility to ESD events. In one example, the reduction in gate oxide thickness reduces the maximum gate-drain, gate-source voltage that can be withstood by the device during an ESD event. In another example, the use of multiple voltage rails or domains for power saving purposes can leave a device susceptible to ESD-generated damage to lower voltage gates when higher voltages are used for interfacing with external devices, and lower voltages are provided to operate core circuits. In the latter example, a stack of low threshold voltage transistors may be used to provide I/O drivers that switch within voltage ranges greater than core voltage ranges.

Electrostatic discharge (ESD) events can generate voltages or currents within an IC device that exceed rated operating parameters, including rated operating voltage. Rated operating voltage may lie within a nominal operating range of voltage levels defined for certain devices, circuits or interface pads. Without adequate protection, circuits can be damaged near interface pads facilitate I/O or other sources or entry points of the ESD events. ESD events may occur due to some combination of grounding failures, handling and accumulation of static charge at a surface or point of contact near the IC device. There is a need for enhancement of ESD protection circuits that can be implemented without compromising high-speed performance aspects of I/O driver circuits.

Certain aspects of this disclosure are described in relation to a charged-device model (CDM) characterization of ESD events. The CDM relates to an ESD event that occurs when a chip, chip carrier or package that includes an IC device contacts a low impedance electrical path. A sudden discharge of energy can occur if the chip, chip carrier or package is carrying an accumulated electrostatic charge, causing a high-voltage pulse or spike at I/O pads of the IC device. The voltage observable at one or more I/O pads may exceed rated tolerances for transistors in the IC device and can cause breakdown or other damage to transistor gates and other features of the IC device if adequate ESD protection is not provided.

FIG. 1 illustrates an example of an ESD event 100 that may be characterized by a CDM. The illustrated ESD event 100 occurs as an IC device 102 is placed on a metal or other conductive surface 104. In some examples, this type of ESD event 100 may occur at a manufacturing or assembly facility when IC devices on chips, chip carriers or packages are accumulated, assembled or sorted before being placed and bonded or soldered to a circuit board. In some examples, this type of ESD event 100 may occur at a manufacturing facility when IC devices 102 are picked up by a robot and placed on a circuit board or in a shipment package, where the robot may serve as the conductive surface 104. As the IC device 102 is placed on the conductive surface 104, accumulated charge in the IC device 102 may be discharged to the conductive surface 104 through one or more potential gradients 106, 108. Discharge may occur before or after I/O pins or pads are directly coupled to the conductive surface 104.

The graph 120 illustrates an example of a type of ESD event 100 as characterized by a CDM. In this example, a high percentage of the electrostatic energy accumulated in the IC device 102 is discharged over a short period of time 122 in an initial pulse or spike 130. In one example, the ESD event 100 may have a duration 124 that lasts for approximately 5 nanoseconds with the initial spike 130 ending after approximately 1 nanosecond. In some instances, the discharge may result in a first peak 126 at a current level 128 of 4.7 amps or more. The current spike flowing through an I/O pad of the IC device 102 may cause a correspondent spike in voltage in the interface circuits of the IC device 102.

Figure 2:
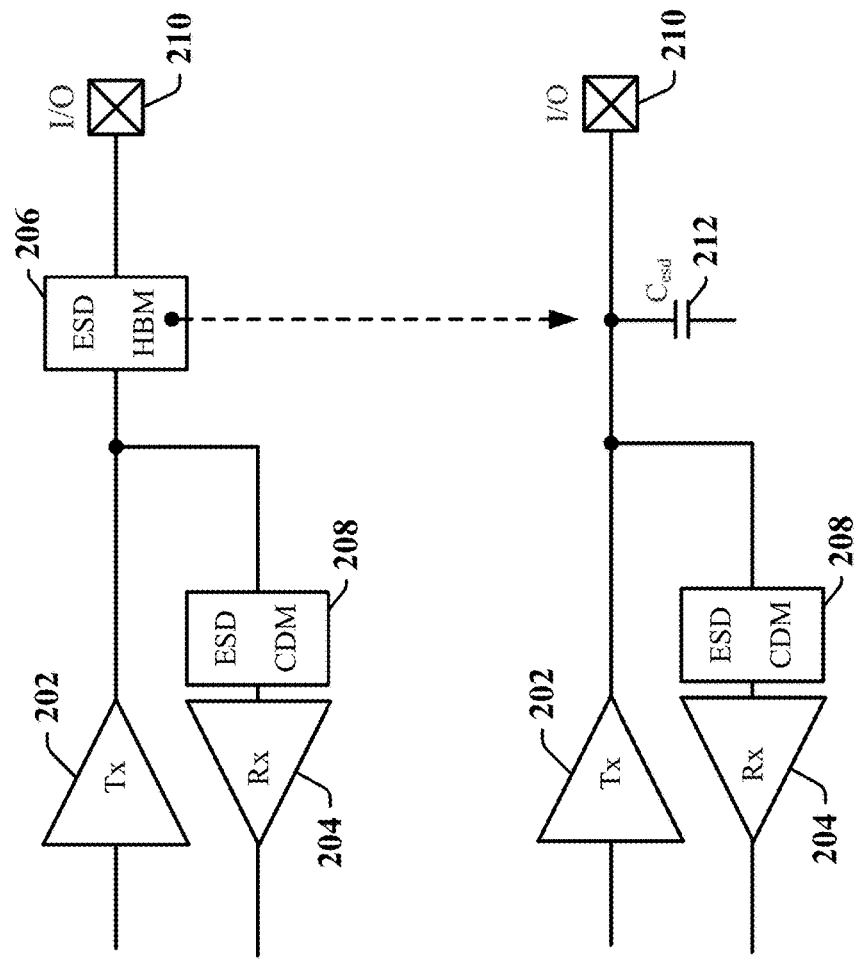
FIG. 2 illustrates an example of an ESD protection scheme implemented for input/out circuits in an integrated circuit device.

FIG. 2 illustrates a typical ESD protection scheme implemented for input/out (I/O) circuits in IC devices. An I/O pad 210 is coupled to the output of a transmitter circuit 202 and to the input of a receiver circuit 204. A first ESD protection circuit 206 coupled to the I/O pad 210 mitigates the effects of HBM events for both the transmitter circuit 202 and the receiver circuit 204. A second ESD protection circuit 208 that is configured to mitigate the effects of CDM events may be integrated within the transmitter circuit 202, the receiver circuit 204 or within common circuit associated with an I/O pad.

The ESD protection circuits 206, 208 can significantly increase the capacitance of interconnects to which they are coupled. The first ESD protection circuit 206 may be designed to handle the larger surge currents associated with HBM events and can have a deleterious effect on I/O device performance due to the large effective capacitance 212 added to the I/O pad 210. Improvements in process technology made with the objective of increasing transistor switching speed tend to reduce physical transistor size. Transistor size is a determining factor of the ability of the transistor to withstand excess voltages. Smaller transistor geometries may require more robust ESD protection circuits, which occupy larger areas on a semiconductor device. ESD protection circuits use bypass diodes to redirect ESD surge currents away from the transistors of I/O circuit. The robustness of an ESD protection circuit may be increased by increasing the size of the bypass diodes. The increased capacitance associated with increased diode size in ESD protection circuits can limit the speed of I/O circuits and the data rate in high-speed interfaces.

The tradeoff between performance and ESD robustness is an ongoing challenge for high-speed transmitter design. The ESD protection circuit 206 that mitigates the effects of HBM events is a major or primary contributor to capacitance 212 associated with an I/O pad. Lower device tolerance limits associated with reduced transistor size and larger package size often requires the use of larger HBM diodes to meet ESD requirements, resulting in increased I/O pad capacitance 212 and decreased performance.

Current ESD protection schemes employed to protect output drivers typically include diodes connected between an interface pad and output power supply rails and may include a clamping circuit with a discharge path that can carry the ESD current during an ESD event.

Figure 3:
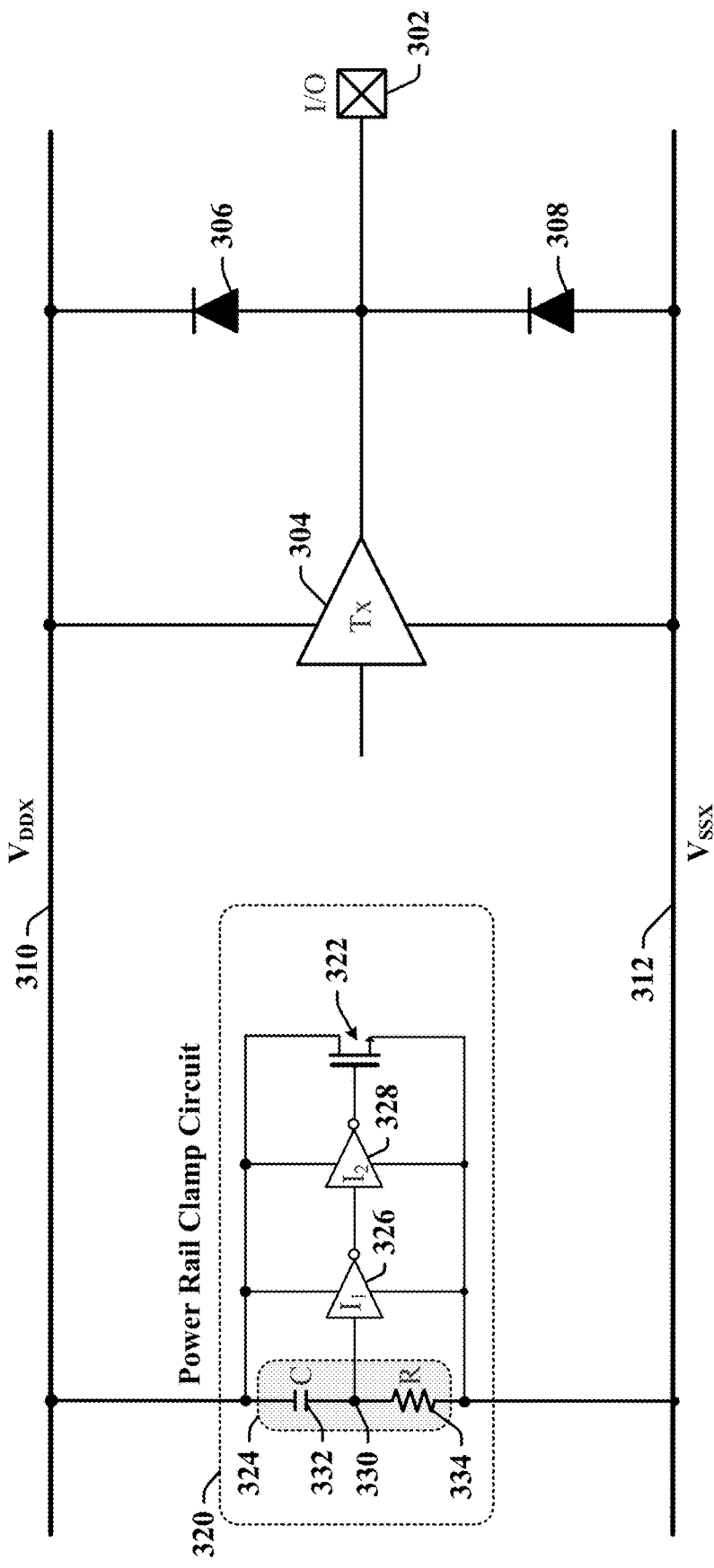
FIG. 3 illustrates an example of an interface circuit that provides ESD protection in an integrated circuit device.

FIG. 3 illustrates an example of an interface circuit 300 that provides ESD protection in an IC device. The interface circuit 300 may be incorporated in an LPDDR SDRAM or in an IC, SoC or another device communicatively coupled to an LPDDR SDRAM. In the illustrated example, the interface circuit 300 includes a driver 304 that can be used to transmit signals through an I/O pad 302 of the IC device. The driver 304 may be configured to provide an output that switches between a power rail ($V_{DDX}$ 310) and a ground reference ($V_{SSX}$ 312). ESD protection is provided by a pair of diodes 306, 308. A first diode 306 is coupled to $V_{DDX}$ 310 and to the I/O pad 302 and is reverse biased when the voltage of the I/O pad 302 remains below $V_{DDX}$ 310. A second diode 308 is coupled to $V_{SSX}$ 312 and to the I/O pad 302 and is reverse biased when the voltage of the I/O pad 302 remains above $V_{SSX}$ 312. An ESD event may cause a current surge that is conducted through the I/O pad 302 and through one or more interconnects coupled to the I/O pad 302, including interconnects that couple the I/O pad 302 and the driver 304. While the interconnects have a low resistance, the voltage of the I/O pad 302 relative to $V_{DDX}$ 310 and/or $V_{SSX}$ 312 can significantly change when conducting a multi-amp ESD surge current. The change in voltage may be sufficient to forward bias one of the diodes 306, 308, thereby enabling the ESD surge current to be diverted to $V_{DDX}$ 310 or $V_{SSX}$ 312 away from the driver 304 and other circuits of the IC device.

The diversion of the ESD surge current to $V_{DDX}$ 310 or $V_{SSX}$ 312 can increase the voltage difference between $V_{DDX}$ 310 and $V_{SSX}$ 312, which can stress or damage devices in the interface circuit 300 if left unchecked. The illustrated interface circuit 300 includes a power rail clamping circuit 320 that is coupled between $V_{DDX}$ 310 and $V_{SSX}$ 312. The power rail clamping circuit 320 includes an N-type metal-oxide-semiconductor (NMOS) transistor 322 that is biased by a serial RC network 324. The RC network 324 has a capacitor 332 coupled in series with a resistor 334. In the illustrated example, the serial RC network 324 is coupled between power supply $V_{DDX}$ 310 and the ground reference $V_{SSX}$ 312. A node 330 coupling the capacitor 332 and the resistor 334 is coupled to the gate of the transistor 322 through a buffer amplifier arrangement including first and second series-connected inverters 326, 328. The power rail clamping circuit 320 ensures a low impedance path from $V_{DDX}$ 310 to $V_{SSX}$ 312 when an ESD pulse applied to the I/O pad 302 causes the voltage difference between $V_{DDX}$ 310 and $V_{SSX}$ 312 to increase.

In one example, a rising voltage on $V_{DDX}$ 310 is coupled through the capacitor 332 to the input of the first inverter 326 forcing its output low. In response, the output of the second inverter 328 goes high turning on the transistor 322. When the transistor 322 turns on, the ESD discharge current can begin to flow between $V_{DDX}$ 310 and $V_{SSX}$ 312.

Figure 4:
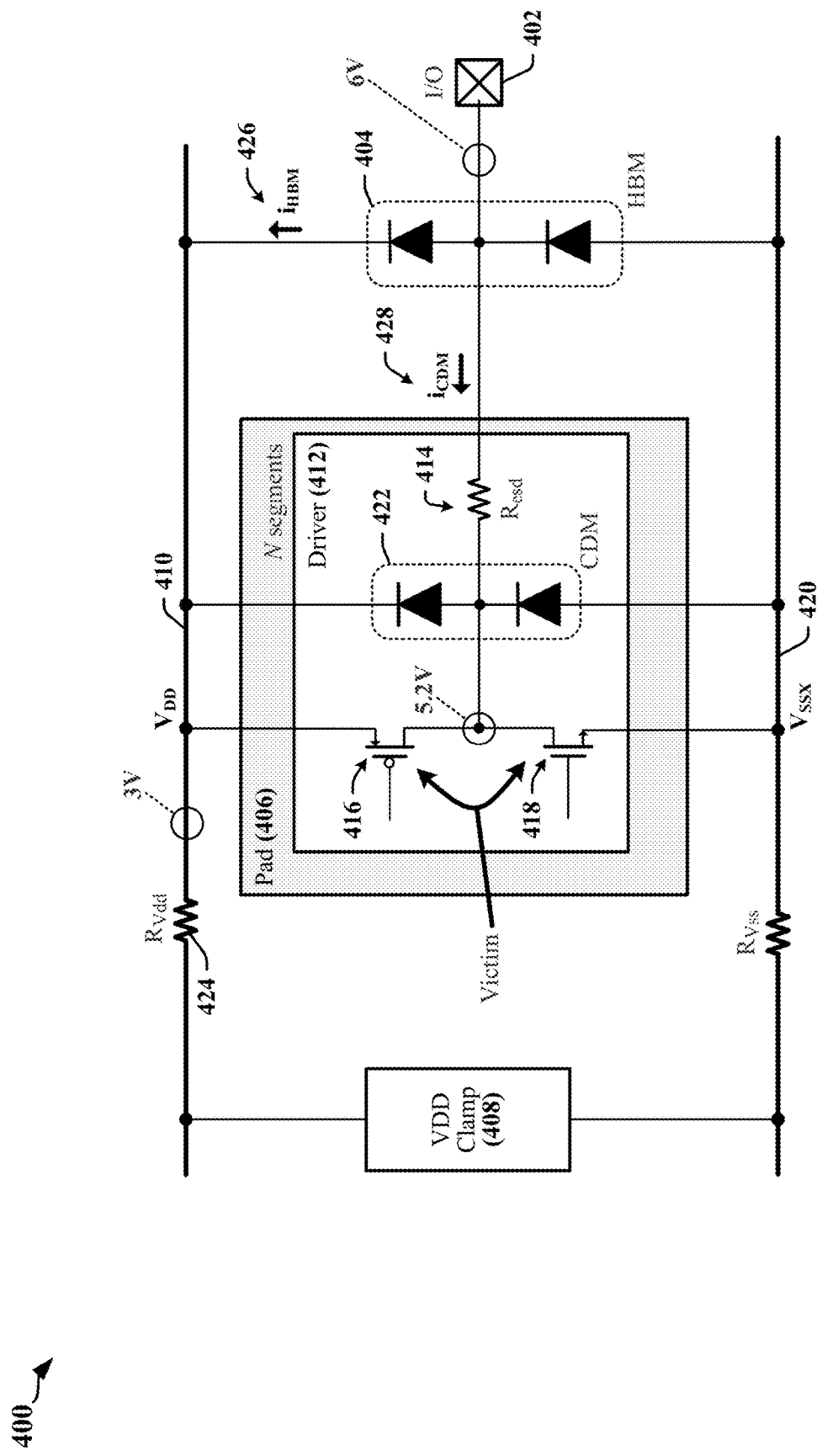
FIG. 4 illustrates an example in which HBM and CDM ESD protection circuits are provided in an interface circuit of an integrated circuit device.

FIG. 4 illustrates an example of HBM and CDM ESD protection circuits in an interface circuit 400 of an IC device. The interface circuit 400 may be incorporated in an LPDDR SDRAM or in an IC, SoC or another device communicatively coupled to an LPDDR SDRAM. The interface circuit 400 includes a driver 412 that can be used to transmit signals through an I/O pad 402 of the IC device. The driver 412 may be one of multiple (N) drivers provided in a pad interface circuit 406. The driver 412 may be configured to provide an output that switches between a power rail ($V_{DD}$ 410) and a ground reference ($V_{SS}$ 420). HBM ESD protection is provided by a first pair of diodes 404 that is coupled between $V_{DD}$ 410 and $V_{SS}$ 420. The diodes in the first pair of diodes 404 are coupled at a center point and reverse biased when the voltage of the I/O pad 402 remains within the voltage range defined as the difference between $V_{DD}$ 410 and $V_{SS}$ 420. CDM ESD protection is provided by a second pair of diodes 422 that is coupled between $V_{DD}$ 410 and $V_{SS}$ 420. The diodes in the second pair of diodes 422 are coupled at a center point and reverse biased when the voltage of the I/O pad 402 remains within the voltage range defined by $V_{DD}$ 410 and $V_{SS}$ 420.

The center point of the first pair of diodes 404 is coupled to the I/O pad 402 and further coupled to the center point of the second pair of diodes 422 through a resistive interconnect or a resistive element 414. The resistive element 414 may include the resistance introduced by the interconnect used to couple the center points of the first pair of diodes 404 and the second pair of diodes 422. The output of the driver 412 is driven by a pair of transistors 416, 418, which are coupled to the center point of the second pair of diodes 422.

The pair of transistors 416, 418 are victims of the effects of an ESD event affecting the I/O pad 402, although these effects are mitigated to some extent by the HBM and CDM protection circuits (i.e., the pairs of diodes 404, 422). An ESD event may cause a current surge that is conducted through the I/O pad 402 and through one or more interconnects coupled to the I/O pad 402, including interconnects that couple the I/O pad 402 and the driver 412. While the interconnects have a low resistance, the voltage of the I/O pad 402 relative to $V_{DD}$ 410 and/or $V_{SS}$ 420 can significantly change when conducting a multi-amp ESD surge current. The change in voltage may be sufficient to forward bias one of the diodes in each of the pairs of diodes 404, 422, thereby enabling the ESD surge current to be diverted to $V_{DD}$ 410 or $V_{SS}$ 420 away from the driver 412 and/or the pair of transistors 416, 418. In one example, one portion ($i_{HBM}$ 426) of the current surge may be conducted through the first pair of diodes 404 and another portion ($i_{CDM}$ 428) of the current surge may be conducted through the second pair of diodes 422.

The diversion of the ESD surge current to $V_{DD}$ 410 or $V_{SS}$ 420 can increase the voltage difference between $V_{DD}$ 410 and $V_{SS}$ 420, which can stress or damage devices in the interface circuit 400 if left unchecked. The illustrated interface circuit 400 includes a power rail clamping circuit 408 that is coupled between $V_{DD}$ 410 and $V_{SS}$ 420. The power rail clamping circuit 408 includes a serial RC network that provides a trigger signal used to activate the power rail clamping circuit 408. The power rail clamping circuit 408 ensures a low impedance path from $V_{DD}$ 410 to $V_{SS}$ 420 when an ESD pulse applied to the I/O pad 402 causes the voltage difference between $V_{DD}$ 410 and $V_{SS}$ 420 to increase.

In many conventional systems, victim devices see higher stress voltage during an ESD event. In the example illustrated in FIG. 4, the I/O pad 402 may rise to 6V. The voltage on the $V_{DD}$ power rail applied to the driver 412 may be at 3 volts, reflecting the combination of the clamp voltage enforced by the power rail clamping circuit 408 and the voltage drop over the interconnect resistance 424 on $V_{DD}$ 410. The use of the power rail clamping circuit 408 can limit overvoltage stress to the victim transistors 416, 418 to 5.2V, based on the difference between voltage applied to the gate and the voltage at the drain and/or source of the victim transistors 416, 418. In some implementations, an RC trigger signal causes the gate of the victim transistors 416, 418 to be pulled to the voltage level of $V_{DD}$ 410. In one example, the RC trigger signal may be generated based on the voltage level at the node 330 in the RC network 324 illustrated in FIG. 3. However, this approach focuses specifically on reducing gate oxide stress and is typically designed to protect specific signal paths.

According to certain aspects of this disclosure, enhanced ESD robustness and improved device signaling performance can be obtained using a secondary ESD protection circuit that is decoupled from the signal path. In one aspect, I/O pad capacitance can be constrained or reduced through the use of the secondary ESD protection circuit and an associated localized voltage rail clamp coupled to a pseudo-power supply in order to create an alternative path for diverting surge current such that high voltage is dropped across the series resistor coupling HBM and CDM ESD protection circuits.

Figure 5:
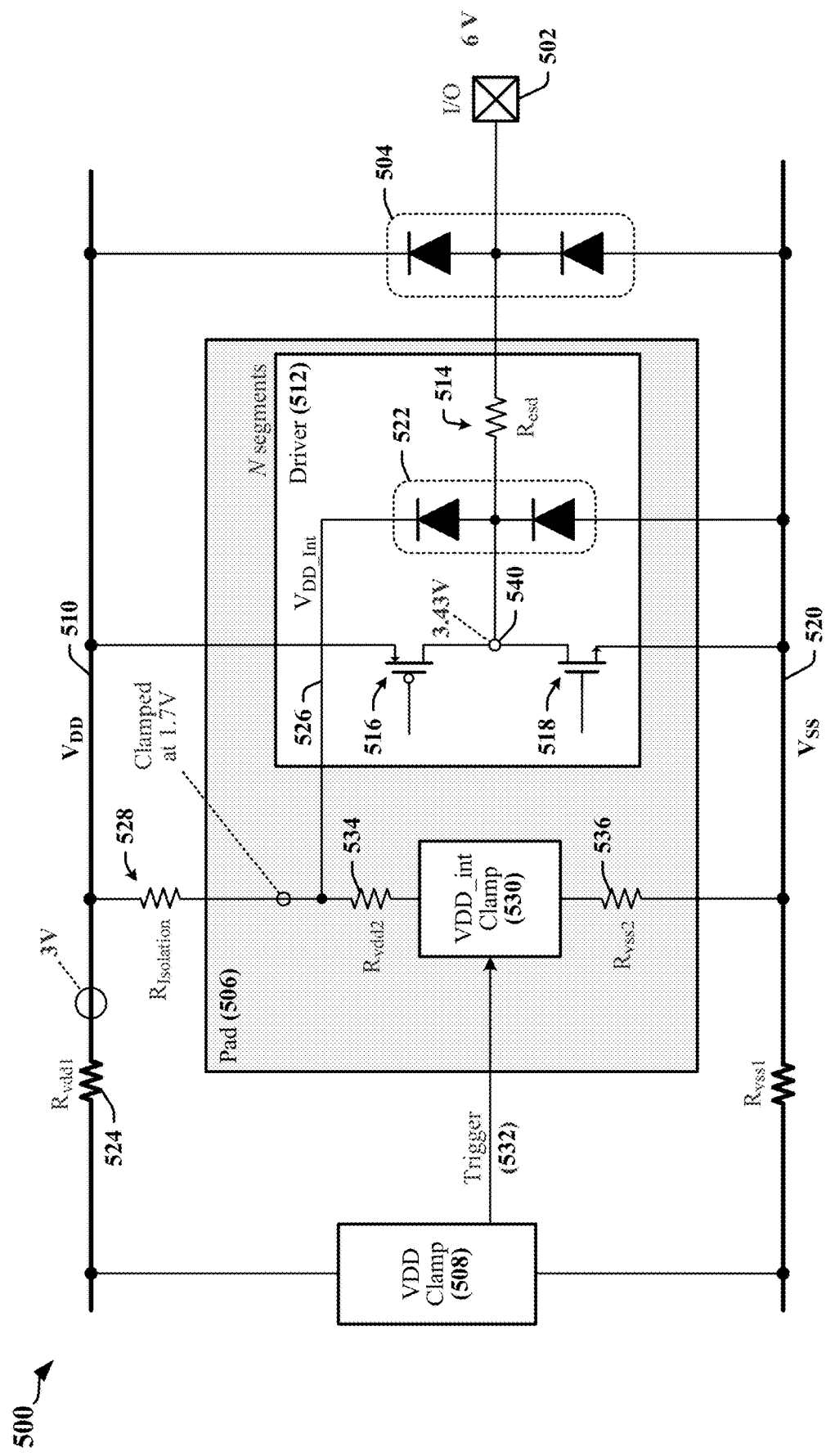
FIG. 5 illustrates an example of HBM and CDM ESD protection circuits in which HBM and CDM ESD protection circuits are provided in an interface circuit configured in accordance with certain aspects of this disclosure.

FIG. 5 illustrates an example of HBM and CDM ESD protection circuits in an interface circuit 500 configured in accordance with certain aspects of this disclosure. The interface circuit 500 may be incorporated in an LPDDR SDRAM or in an IC, SoC or another device that is communicatively coupled to LPDDR SDRAM. The interface circuit 500 includes a driver circuit 512 that can be used to transmit signals through an I/O pad 502 of the IC device. The driver circuit 512 may be one of multiple (N) drivers provided in the pad interface circuit 506. The driver circuit 512 may be configured to provide an output that switches between a power rail ($V_{DD}$ 510) and a ground reference ($V_{SS}$ 520).

HBM ESD protection is provided by a first pair of diodes 504 that is coupled between $V_{DD}$ 510 and $V_{SS}$ 520. The diodes in the first pair of diodes 504 are coupled at a center point and reverse biased when the voltage of the I/O pad 502 remains within the voltage range defined by $V_{DD}$ 510 and $V_{SS}$ 520.

CDM ESD protection is provided by a second pair of diodes 522 that is coupled between an internal or pseudo power rail (VDD_Int 526) and VSS 520. The diodes in the second pair of diodes 522 are coupled at a center point and reverse biased when the voltage of the I/O pad 502 remains within the voltage range defined by VDD_Int 526 and VSS 520.

The center point of the first pair of diodes 504 is coupled to the I/O pad 502. The center point of the first pair of diodes 504 is further coupled to the center point of the second pair of diodes 522 through a resistive interconnect or a resistive element 514. The resistive element 514 may include the resistance introduced by an interconnect used to couple the center points of the first pair of diodes 504 and the second pair of diodes 522. The output of the driver circuit 512 is driven by a pair of transistors 516, 518, which are coupled to the center point of the second pair of diodes 522.

The diversion of the ESD surge current to $V_{DD}$ 510 or $V_{SS}$ 520 can increase the voltage difference between $V_{DD}$ 510 and $V_{SS}$ 520, which can stress or damage devices in the interface circuit 500 if left unchecked. The illustrated interface circuit 500 includes a primary power rail clamping circuit 508 that is coupled between $V_{DD}$ 510 and $V_{SS}$ 520. The primary power rail clamping circuit 508 includes a serial RC network that provides a trigger signal 532 used to activate the primary power rail clamping circuit 508. The primary power rail clamping circuit 508 ensures a low impedance path from $V_{DD}$ 510 to $V_{SS}$ 520 when an ESD pulse applied to the I/O pad 502 causes the voltage difference between $V_{DD}$ 510 and $V_{SS}$ 520 to increase.

The diversion of the ESD surge current to $V_{DD\_Int}$ 526 or $V_{SS}$ 520 can increase the voltage difference between $V_{DD\_Int}$ 526 and $V_{SS}$ 520. The illustrated interface circuit 500 includes an internal power rail clamping circuit 530 that is internal to the pad interface circuit 506 and coupled between $V_{DD\_Int}$ 526 and $V_{SS}$ 520. The internal power rail clamping circuit 530 responds to the trigger signal 532 generated by the primary power rail clamping circuit 508. In effect, the internal power rail clamping circuit 530 is activated when the primary power rail clamping circuit 508 is activated. The uses of the externally generated trigger signal 532 can enable a simplified design of the internal power rail clamping circuit 530 with economical consumption of real estate of the integrated circuit. The internal power rail clamping circuit 530 ensures a low impedance path from $V_{DD\_Int}$ 526 to $V_{SSX}$ 520 when an ESD pulse applied to the I/O pad 502 causes the voltage difference between $V_{DD\_Int}$ 526 and $V_{SSX}$ 520 to increase.

The interconnects that couple the internal power rail clamping circuit 530 between $V_{DD}$ 510 and $V_{SS}$ 520 contribute resistances 534, 536 that can be small and yet cause significantly large voltage drops when current flow in the interconnects increases during ESD discharge. The internal power rail clamping circuit 530 is coupled to $V_{DD}$ 510 through an isolation resistor 528 that has a value selected to restrict current flow from $V_{DD}$ 510 during ESD events. The resistance value of the isolation resistor 528 has a resistance value that can be selected according to design or application requirements. Typically, the isolation resistor 528 has a resistance value that exceeds 5 KΩ. In one example, the isolation resistor 528 has a resistance value of 20 KΩ. In other examples, the isolation resistor 528 has a resistance value that lies in the range of 10 KΩ to 33 KΩ. $V_{DD}$ 510 and $V_{DD\_Int}$ 526 are at the same voltage level during normal operation and when no ESD event is occurring. Under these conditions, the power rail clamping circuits 508, 530 are disabled and a small leakage current or an absence of leakage current produces little or no voltage drop across the isolation resistor 528.

The internal power rail clamping circuit 530 operates to limit the voltage level at the output 540 of the transistors 516, 518. The voltage at the output 540 of the transistors 516, 518 during an ESD event may be calculated as the sum of clamp voltage provided by the internal power rail clamping circuit 530, the voltage drop across the interconnect resistance 534 and the diode forward bias voltage. In the illustrated example, the voltage at the output 540 of transistors 516, 518 when an ESD event that produces a 6 Volts level at the I/O pad may be calculated as of 3.43 Volts. The current surge resulting from the ESD event raises $V_{DD}$ 510 to approximately 3 Volts calculated as the sum of the clamp voltage provided by the primary power rail clamping circuit 508 and the voltage drop across interconnect resistance 524. In some instances, the stress on the transistors 516, 518 is reduced to a pullup stress of 0.52 Volts and a pulldown stress of 3.43 Volts when the internal power rail clamping circuit 530 is used. The pullup stress refers the overvoltage on transistor 516 and the pulldown stress refers the overvoltage on transistor 518. In conventional systems, the pullup stress can be expected to be 2.16 Volts and a pulldown stress of 5.12 Volts. For reference, certain specifications for 6 ampere CDM limits specify a maximum stress of 3.5 Volts.

The internal power rail clamping circuit 530 provides a current bypass path only when enabled during an ESD event. The internal power rail clamping circuit 530 can be implemented in a physical area that is significantly smaller that the area required for the primary power rail clamping circuit 508. The configuration of the internal power rail clamping circuit 530 and the use of the pseudo power rail ($V_{DD\_Int}$ 526) can reduce or eliminate the constraints on the size of the diodes in the first pair of diodes 504 that provide HBM ESD protection. The configuration of the internal power rail clamping circuit 530 and the use of the pseudo power rail ($V_{DD\_Int}$ 526) can reduce or eliminate the constraints on the size of the resistive element 514 that couples the first pair of diodes 504 and the second pair of diodes 522. In some instances, the configuration of the internal power rail clamping circuit 530 and the use of the pseudo power rail ($V_{DD\_Int}$ 526) can relax ESD constraints on driver design. In some instances, the configuration of the internal power rail clamping circuit 530 and the use of the pseudo power rail ($V_{DD\_Int}$ 526) can permit reductions in HBM diode size and corresponding I/O pad capacitance, thereby boosting bandwidth through increased switching frequencies.

The interface circuit 500 illustrated in FIG. 5 represents one configuration of a driver circuit 512 that may be combined with HBM and CDM ESD protection circuits in accordance with certain aspects of this disclosure. In the illustrated example, the driver circuit 512 includes a transistor 516 that is depicted as a P-type metal-oxide-semiconductor (PMOS) transistor and a transistor 518 that is depicted as an NMOS transistor. The type of transistors, number of transistors and configuration of transistors included in the driver circuit 512 can vary according to design and/or application needs. For example, transistor 516 in the driver circuit 512 may be implemented using a PMOS transistor, an NMOS transistor or a combination of PMOS and NMOS transistors in other implementations of a driver circuit that is combined with HBM and CDM ESD protection circuits in accordance with certain aspects of this disclosure.

Figure 6:
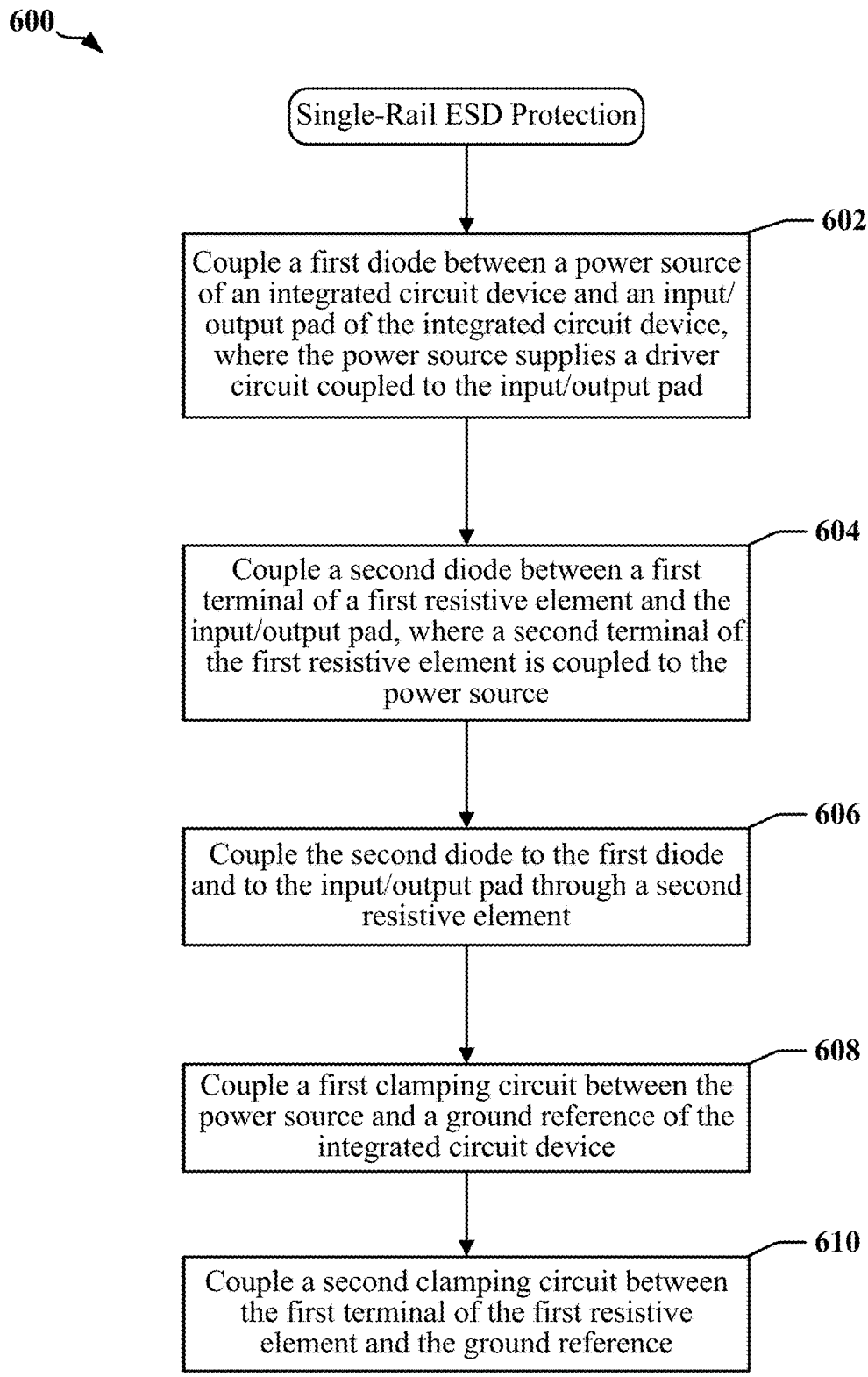
FIG. 6 is a flow diagram illustrating an example of a method for providing ESD protection in accordance with certain aspects disclosed herein.

FIG. 6 is a flow diagram illustrating an example of a method 600 for providing ESD protection in accordance with certain aspects disclosed herein. The method may relate to various concepts, aspects and features of the ESD protection circuit illustrated in FIG. 5.

At block 602, a first diode is coupled between a power source of an integrated circuit device and an I/O pad of the integrated circuit device. In some examples, the power source supplies a driver circuit coupled to the input/output pad. At block 604, a second diode is coupled between a first terminal of a first resistive element and the I/O pad. A second terminal of the first resistive element is coupled to the power source. At block 606, a first clamping circuit is coupled between the power source and a ground reference of the integrated circuit device. At block 610, a second clamping circuit is coupled between the first terminal of the first resistive element and the ground reference. The first resistive element may have a resistance configured to restrict current flow between the power source and the second clamping circuit during an electrostatic discharge event. In certain implementations, the resistance of the first resistive element exceeds 5 kiloohms. In one example, the first resistive element has a resistance of 20 kiloohms.

In some implementations, the second clamping circuit is activated during an electrostatic discharge event by a trigger signal provided by the first clamping circuit. The electrostatic discharge current enters the integrated circuit device through the I/O pad during an electrostatic discharge event.

In some examples, the second resistive element includes an interconnect that couples a terminal of the second diode to a corresponding terminal of the first diode and that has a resistance that produces a voltage differential between the terminal of the second diode and the corresponding terminal of the first diode during an electrostatic discharge event. The second resistive element may include a parasitic resistance.

In various implementations, a third diode has a first terminal is coupled to the ground reference and a second terminal that is coupled to the I/O pad and a fourth diode that has a first terminal coupled to the ground reference and a second terminal that is coupled to the I/O pad. The first diode, the second diode, the third diode and the fourth diode may be reverse biased before the electrostatic discharge current enters the integrated circuit device.

It is noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering. In certain aspects, an apparatus performing certain functions disclosed herein may include means for driving an I/O pad of an integrated circuit device; means for diverting a first portion of an electrostatic discharge current that is conducted through the I/O pad, including a first diode that is coupled between a power source of the integrated circuit device and the I/O pad; means for diverting a second portion of the electrostatic discharge current, including a second diode that is coupled between a first terminal of a first resistive element and the I/O pad. A second terminal of the first resistive element is coupled to the power source. A terminal of the second diode is coupled to the I/O pad through a resistive element coupled to a corresponding terminal of the first diode. In one example, the power source supplies the means for driving the I/O pad.

The apparatus may further include means for clamping voltages, including a first clamping circuit coupled between the power source and a ground reference of the integrated circuit device and a second clamping circuit coupled between the first terminal of the first resistive element and the ground reference.

In various implementations, the first resistive element has a resistance configured to restrict current flow between the power source and the second clamping circuit during an electrostatic discharge event. The resistance of the first resistive element exceeds 5 kiloohms. In one example, the first resistive element provides a resistance of 20 kiloohms.

In some implementations, the second clamping circuit is activated during an electrostatic discharge event by a trigger signal provided by the first clamping circuit. The electrostatic discharge current may enter the integrated circuit device through the I/O pad during an electrostatic discharge event.

In certain examples, the second resistive element includes an interconnect that couples a terminal of the second diode to a corresponding terminal of the first diode and that has a resistance that produces a voltage differential between the terminal of the second diode and the corresponding terminal of the first diode during an electrostatic discharge event. The second resistive element may include parasitic resistances.

The means for diverting the first portion of the electrostatic discharge current may further include a third diode having a first terminal coupled to the ground reference and a second terminal coupled to the I/O pad. The means for diverting the second portion of the electrostatic discharge current may further include a fourth diode having a first terminal coupled to the ground reference and a second terminal coupled to the I/O pad. The first diode, the second diode, the third diode and the fourth diode may be reverse biased before the electrostatic discharge current enters the integrated circuit device.

In one implementation, an electrostatic discharge protection circuit in an interface circuit has a first diode coupled between a power source of an IC device and an I/O pad of the IC device, a first resistive element having a first terminal coupled to the power source and a second terminal coupled to the I/O pad through a second diode, a second resistive element that couples the second diode to the first diode and to the I/O pad, a first clamping circuit coupled between the power source and a ground reference of the IC device, and a second clamping circuit coupled between the first terminal of the first resistive element and the ground reference. The power source may supply a driver circuit coupled to the I/O pad.

The first resistive element has a resistance configured to restrict current flow between the power source and the second clamping circuit during an electrostatic discharge event. The resistance of the first resistive element typically exceeds 5 KΩ. The first resistive element may have a resistance value between 10 KΩ and 33 KΩ. In some examples, the first resistive element has a resistance value of 20 KΩ. In some examples, the first resistive element has a resistance value greater than 33 KΩ. In some examples, the first resistive element has a resistance value less than 5 KΩ.

In some examples, the second resistive element comprises an interconnect that couples a terminal of the second diode to a corresponding terminal of the first diode and that has a resistance that produces a voltage differential between the terminal of the second diode and the corresponding terminal of the first diode during an electrostatic discharge event. The second resistive element may include parasitic resistance.

In some examples, the second clamping circuit is activated during an electrostatic discharge event by a trigger signal provided by the first clamping circuit. The first clamping circuit and the second clamping circuit may be configured to divert at least a portion of an electrostatic discharge current from the driver circuit. The electrostatic discharge current may enter the integrated circuit device through the I/O pad during an electrostatic discharge event.

In some implementations, electrostatic discharge protection circuit has a third diode having a first terminal coupled to the ground reference and a second terminal coupled to the I/O pad, and a fourth diode having a first terminal coupled to the ground reference and a second terminal coupled to the I/O pad. The first diode, the second diode, the third diode and the fourth diode are reverse biased before the electrostatic discharge current enters the IC device.

Some implementation examples are described in the following numbered clauses:

1. An electrostatic discharge protection circuit in an interface circuit, comprising: a first diode coupled between a power source of an integrated circuit device and an input/output pad of the integrated circuit device, wherein the power source supplies a driver circuit coupled to the input/output pad; a second diode coupled between a first terminal of a first resistive element and the input/output pad, wherein a second terminal of the first resistive element is coupled to the power source; a second resistive element that couples the second diode to the first diode and to the input/output pad; a first clamping circuit coupled between the power source and a ground reference of the integrated circuit device; and a second clamping circuit coupled between the first terminal of the first resistive element and the ground reference.
2. The electrostatic discharge protection circuit as described in clause 1, wherein the first resistive element has a resistance configured to restrict current flow between the power source and the second clamping circuit during an electrostatic discharge event.
3. The electrostatic discharge protection circuit as described in clause 2, wherein the resistance of the first resistive element exceeds 5 kiloohms.
4. The electrostatic discharge protection circuit as described in any of clauses 1-3, wherein the second clamping circuit is activated during an electrostatic discharge event by a trigger signal provided by the first clamping circuit.
5. The electrostatic discharge protection circuit as described in clause 4, wherein the first clamping circuit and the second clamping circuit are configured to divert at least a portion of an electrostatic discharge current from the driver circuit.
6. The electrostatic discharge protection circuit as described in clause 5, wherein the electrostatic discharge current enters the integrated circuit device through the input/output pad during an electrostatic discharge event.
7. The electrostatic discharge protection circuit as described in any of clauses 1-6, wherein the second resistive element comprises an interconnect that couples a terminal of the second diode to a corresponding terminal of the first diode and that has a resistance that produces a voltage differential between the terminal of the second diode and the corresponding terminal of the first diode during an electrostatic discharge event.
8. The electrostatic discharge protection circuit as described in any of clauses 1-7, wherein the second resistive element comprises a parasitic resistance.
9. The electrostatic discharge protection circuit as described in any of clauses 1-8, further comprising: a third diode having a first terminal coupled to the ground reference and a second terminal coupled to the input/output pad; and a fourth diode having a first terminal coupled to the ground reference and a second terminal coupled to the input/output pad.
10. The electrostatic discharge protection circuit as described in clause 9, wherein the first diode, the second diode, the third diode and the fourth diode are reverse biased before the electrostatic discharge current enters the integrated circuit device.
11. An apparatus, comprising: means for driving an input/output pad of an integrated circuit device; means for diverting a first portion of an electrostatic discharge current that is conducted through the input/output pad, including a first diode that is coupled between a power source of the integrated circuit device and the input/output pad, wherein the power source supplies the means for driving the input/output pad; means for diverting a second portion of the electrostatic discharge current, including a second diode that is coupled between a first terminal of a first resistive element and the input/output pad, wherein a second terminal of the first resistive element is coupled to the power source, and wherein a terminal of the second diode is coupled to the input/output pad and to a corresponding terminal of the first diode through a second resistive element; and means for clamping voltages, including a first clamping circuit coupled between the power source and a ground reference of the integrated circuit device and a second clamping circuit coupled between the first terminal of the first resistive element and the ground reference.
12. The apparatus as described in clause 11, wherein the first resistive element has a resistance configured to restrict current flow between the power source and the second clamping circuit during an electrostatic discharge event.
13. The apparatus as described in clause 12, wherein the resistance of the first resistive element exceeds 5 kiloohms.
14. The apparatus as described in any of clauses 11-13, wherein the second clamping circuit is activated during an electrostatic discharge event by a trigger signal provided by the first clamping circuit.
15. The apparatus as described in any of clauses 11-14, wherein the electrostatic discharge current enters the integrated circuit device through the input/output pad during an electrostatic discharge event.
16. The apparatus as described in any of clauses 11-15, wherein the second resistive element comprises an interconnect that couples a terminal of the second diode to a corresponding terminal of the first diode and that has a resistance that produces a voltage differential between the terminal of the second diode and the corresponding terminal of the first diode during an electrostatic discharge event.
17. The apparatus as described in any of clauses 11-16, wherein the second resistive element comprises a parasitic resistance.
18. The apparatus as described in any of clauses 11-17, wherein the means for diverting the first portion of the electrostatic discharge current further includes a third diode having a first terminal coupled to the ground reference and a second terminal coupled to the input/output pad and wherein the means for diverting the second portion of the electrostatic discharge current further includes a fourth diode having a first terminal coupled to the ground reference and a second terminal coupled to the input/output pad.

19. The apparatus as described in clause 18, wherein the first diode, the second diode, the third diode and the fourth diode are reverse biased before the electrostatic discharge current enters the integrated circuit device.

20. A method for protecting an interface circuit from electrostatic discharge, comprising: coupling a first diode between a power source of an integrated circuit device and an input/output pad of the integrated circuit device, wherein the power source supplies a driver circuit coupled to the input/output pad; coupling a second diode between a first terminal of a first resistive element and the input/output pad, wherein a second terminal of the first resistive element is coupled to the power source; coupling the second diode to the first diode and to the input/output pad through a second resistive element; coupling a first clamping circuit between the power source and a ground reference of the integrated circuit device; and coupling a second clamping circuit between the first terminal of the first resistive element and the ground reference.

21. The method as described in clause 20, wherein the first resistive element has a resistance configured to restrict current flow between the power source and the second clamping circuit during an electrostatic discharge event.

22. The method as described in clause 21, wherein the resistance of the first resistive element exceeds 5 kiloohms.

23. The method as described in any of clauses 20-22, wherein the second clamping circuit is activated during an electrostatic discharge event by a trigger signal provided by the first clamping circuit.

24. The method as described in any of clauses 20-23, wherein the electrostatic discharge current enters the integrated circuit device through the input/output pad during an electrostatic discharge event.

25. The method as described in any of clauses 20-24, wherein the second resistive element comprises an interconnect that couples a terminal of the second diode to a corresponding terminal of the first diode and that has a resistance that produces a voltage differential between the terminal of the second diode and the corresponding terminal of the first diode during an electrostatic discharge event.

26. The method as described in any of clauses 20-25, wherein the second resistive element comprises a parasitic resistance.

27. The method as described in any of clauses 20-26, further comprising: coupling a third diode having a first terminal coupled to the ground reference and a second terminal coupled to the input/output pad; and coupling a fourth diode having a first terminal coupled to the ground reference and a second terminal coupled to the input/output pad.

28. The method as described in clause 27, wherein the first diode, the second diode, the third diode and the fourth diode are reverse biased before the electrostatic discharge current enters the integrated circuit device.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An electrostatic discharge protection circuit in an interface circuit, comprising:
    a first diode coupled between a power source of an integrated circuit device and an input/output pad of the integrated circuit device, wherein the power source supplies a driver circuit coupled to the input/output pad;
    a second diode coupled between a first terminal of a first resistive element and the input/output pad, wherein a second terminal of the first resistive element is coupled to the power source;
    a second resistive element that couples the second diode to the first diode and to the input/output pad;
    a first clamping circuit coupled between the power source and a ground reference of the integrated circuit device; and
    a second clamping circuit coupled between the first terminal of the first resistive element and the ground reference, wherein the second clamping circuit is activated during an electrostatic discharge event by a trigger signal provided by the first clamping circuit.

2. The electrostatic discharge protection circuit of claim 1, wherein the first resistive element has a resistance configured to restrict current flow between the power source and the second clamping circuit during the electrostatic discharge event.

3. The electrostatic discharge protection circuit of claim 2, wherein the resistance of the first resistive element exceeds 5 kiloohms.

4. The electrostatic discharge protection circuit of claim 1, wherein the first clamping circuit and the second clamping circuit are configured to divert at least a portion of an electrostatic discharge current from the driver circuit.

5. The electrostatic discharge protection circuit of claim 4, wherein the electrostatic discharge current enters the integrated circuit device through the input/output pad during the electrostatic discharge event.

6. The electrostatic discharge protection circuit of claim 1, wherein the second resistive element comprises an interconnect that couples a terminal of the second diode to a corresponding terminal of the first diode and that has a resistance that produces a voltage differential between the terminal of the second diode and the corresponding terminal of the first diode during the electrostatic discharge event.

7. The electrostatic discharge protection circuit of claim 1, wherein the second resistive element comprises a parasitic resistance.

8. The electrostatic discharge protection circuit of claim 1, further comprising:

a third diode having a first terminal coupled to the ground reference and a second terminal coupled to the input/output pad; and a fourth diode having a first terminal coupled to the ground reference and a second terminal coupled to the input/output pad.

9. The electrostatic discharge protection circuit of claim 8, wherein the first diode, the second diode, the third diode and the fourth diode are reverse biased before the electrostatic discharge current enters the integrated circuit device.

10. An apparatus, comprising:
means for driving an input/output pad of an integrated circuit device;
means for diverting a first portion of an electrostatic discharge current that is conducted through the input/output pad, including a first diode that is coupled between a power source of the integrated circuit device and the input/output pad, wherein the power source supplies the means for driving the input/output pad;
means for diverting a second portion of the electrostatic discharge current, including a second diode that is coupled between a first terminal of a first resistive element and the input/output pad, wherein a second terminal of the first resistive element is coupled to the power source, and wherein a terminal of the second diode is coupled to the input/output pad and to a corresponding terminal of the first diode through a second resistive element; and
means for clamping voltages, including a first clamping circuit coupled between the power source and a ground reference of the integrated circuit device and a second clamping circuit coupled between the first terminal of the first resistive element and the ground reference, wherein the second clamping circuit is activated during an electrostatic discharge event by a trigger signal provided by the first clamping circuit.

11. The apparatus of claim 10, wherein the first resistive element has a resistance configured to restrict current flow between the power source and the second clamping circuit during the electrostatic discharge event.

12. The apparatus of claim 11, wherein the resistance of the first resistive element exceeds 5 kiloohms.

13. The apparatus of claim 10, wherein the electrostatic discharge current enters the integrated circuit device through the input/output pad during the electrostatic discharge event.

14. The apparatus of claim 10, wherein the second resistive element comprises an interconnect that couples a terminal of the second diode to a corresponding terminal of the first diode and that has a resistance that produces a voltage differential between the terminal of the second diode and the corresponding terminal of the first diode during the electrostatic discharge event.

15. The apparatus of claim 10, wherein the second resistive element comprises a parasitic resistance.

16. The apparatus of claim 10, wherein the means for diverting the first portion of the electrostatic discharge current further includes a third diode having a first terminal coupled to the ground reference and a second terminal coupled to the input/output pad and wherein the means for diverting the second portion of the electrostatic discharge current further includes a fourth diode having a first terminal coupled to the ground reference and a second terminal coupled to the input/output pad.

17. The apparatus of claim 16, wherein the first diode, the second diode, the third diode and the fourth diode are reverse biased before the electrostatic discharge current enters the integrated circuit device.

18. A method for protecting an interface circuit from electrostatic discharge, comprising:
coupling a first diode between a power source of an integrated circuit device and an input/output pad of the integrated circuit device, wherein the power source supplies a driver circuit coupled to the input/output pad;
coupling a second diode between a first terminal of a first resistive element and the input/output pad, wherein a second terminal of the first resistive element is coupled to the power source;
coupling the second diode to the first diode and to the input/output pad through a second resistive element;
coupling a first clamping circuit between the power source and a ground reference of the integrated circuit device; and
coupling a second clamping circuit between the first terminal of the first resistive element and the ground reference, wherein the second clamping circuit is activated during an electrostatic discharge event by a trigger signal provided by the first clamping circuit.

19. The method of claim 18, wherein the first resistive element has a resistance configured to restrict current flow between the power source and the second clamping circuit during the electrostatic discharge event.

20. The method of claim 19, wherein the resistance of the first resistive element exceeds 5 kiloohms.

21. The method of claim 18, wherein the electrostatic discharge current enters the integrated circuit device through the input/output pad during the electrostatic discharge event.

22. The method of claim 18, wherein the second resistive element comprises an interconnect that couples a terminal of the second diode to a corresponding terminal of the first diode and that has a resistance that produces a voltage differential between the terminal of the second diode and the corresponding terminal of the first diode during the electrostatic discharge event.

23. The method of claim 18, wherein the second resistive element comprises a parasitic resistance.

24. The method of claim 18, further comprising:
coupling a third diode having a first terminal coupled to the ground reference and a second terminal coupled to the input/output pad; and
coupling a fourth diode having a first terminal coupled to the ground reference and a second terminal coupled to the input/output pad.

25. The method of claim 24, wherein the first diode, the second diode, the third diode and the fourth diode are reverse biased before the electrostatic discharge current enters the integrated circuit device.

* * * * *